United States Patent
Chen et al.

(10) Patent No.: US 10,141,223 B2
(45) Date of Patent: Nov. 27, 2018

(54) METHOD OF IMPROVING MICRO-LOADING EFFECT WHEN RECESS ETCHING TUNGSTEN LAYER

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Li-Chiang Chen, Tainan (TW); Fu-Che Lee, Taichung (TW); Ming-Feng Kuo, Tainan (TW)

(73) Assignees: UNITED MICROELECTRONICS CORP., Hsin-Chu (TW); Fujian Jinhua Integrated Circuit Co., Ltd., Quanzhou, Fujian Province ( * ) Notice: Subject to any disclaimer, the term of this patent is extended or adjusted under 35 U.S.C. 154(b) by 0 days.

(21) Appl. No.: 15/869,107

(22) Filed: Jan. 12, 2018

(65) Prior Publication Data
US 2018/0294188 A1 Oct. 11, 2018

(30) Foreign Application Priority Data
Apr. 5, 2017 (CN) .......................... 2017 1 0216987

(51) Int. Cl.
| | |
|---|---|
| H01L 21/768 | (2006.01) |
| H01L 21/321 | (2006.01) |
| H01L 21/3213 | (2006.01) |
| H01L 27/108 | (2006.01) |
| H01L 21/285 | (2006.01) |
| H01L 21/3105 | (2006.01) |

(52) U.S. Cl.
CPC .. *H01L 21/76877* (2013.01); *H01L 21/28568* (2013.01); *H01L 21/31058* (2013.01); *H01L 21/32115* (2013.01); *H01L 21/32136* (2013.01); *H01L 27/10891* (2013.01); *H01L 21/76843* (2013.01)

(58) Field of Classification Search
CPC ......... H01L 21/76877; H01L 21/31058; H01L 21/28568; H01L 27/10891; H01L 21/32136; H01L 21/32115; H01L 21/76843
See application file for complete search history.

(56) References Cited

U.S. PATENT DOCUMENTS

| | | | | |
|---|---|---|---|---|
| 7,189,626 B2 * | 3/2007 | Elkins | ................... | H01L 21/288 257/E21.008 |
| 8,309,448 B2 * | 11/2012 | Hwang | ................. | H01L 21/743 257/E21.646 |
| 8,610,191 B2 | 12/2013 | Moon | | |
| 9,472,454 B2 * | 10/2016 | Hotta | ................ | H01L 21/28556 |

(Continued)

*Primary Examiner* — Bac Au
(74) *Attorney, Agent, or Firm* — Winston Hsu

(57) ABSTRACT

A method of improving micro-loading effect when recess etching a tungsten layer. A substrate having trenches thereon is provided. A tungsten layer is deposited on the substrate and in the trenches. A planarization process is performed to form a planarization layer on the tungsten layer. A first etching process is performed to etch the planarization layer and the tungsten layer with an etch selectivity of planarization layer:tungsten layer=1:1 until the planarization layer is completely removed. A second etching process is performed to etch the remainder of the tungsten layer to recess the tungsten layer within the trenches.

7 Claims, 3 Drawing Sheets

(56) References Cited

U.S. PATENT DOCUMENTS

| | | | |
|---|---|---|---|
| 2002/0142582 A1* | 10/2002 | Kim | H01L 21/7684 438/627 |
| 2006/0097397 A1* | 5/2006 | Russell | H01L 21/76847 257/762 |
| 2006/0211242 A1 | 9/2006 | Hsu | |
| 2010/0144140 A1* | 6/2010 | Chandrashekar | C23C 16/045 438/669 |
| 2015/0041609 A1* | 2/2015 | Lee | F16M 11/10 248/447 |
| 2015/0076624 A1* | 3/2015 | Liu | H01L 21/32115 257/412 |

* cited by examiner

METHOD OF IMPROVING MICRO-LOADING EFFECT WHEN RECESS ETCHING TUNGSTEN LAYER

CROSS REFERENCE TO RELATED APPLICATION

This application claims the priority from CN application No. 201710216987.4, filed Apr. 5, 2017, which is included in its entirety herein by reference.

BACKGROUND OF THE INVENTION

1. Field of the Invention

The present invention relates to the technical field of semiconductor manufacturing, and more particularly, to a method for improving micro-loading effect when recess etching a tungsten layer.

2. Description of the Prior Art

It is known that during the manufacturing process of DRAM devices, the buried word lines are usually formed by the steps of forming buried word line trenches in the semiconductor substrate, and then depositing a tungsten layer in the buried word line trenches and on the semiconductor substrate by chemical vapor deposition (CVD), followed by recess etching the tungsten layer until the upper surface of the tungsten layer is lower than the main surface of the semiconductor substrate.

One disadvantage of the above method is that the surface roughness of the tungsten layer after being deposited is too large so that a micro loading effect may occur during the step of etching the tungsten layer and cause the upper surfaces of the tungsten layer in the buried word line trenches are not located at the same horizontal level, which has an adverse effect on the electrical performance of the DRAM devices.

SUMMARY OF THE INVENTION

One object of the present invention is to provide an improved semiconductor process to overcome the deficiencies and disadvantages of the prior art.

An embodiment of the present invention discloses a method for improving micro-loading effect when recess etching a tungsten layer. First, a semiconductor substrate is provided having a main surface, wherein the semiconductor substrate has a plurality of trenches thereon. A tungsten layer is blanket deposited on the semiconductor substrate, and the tungsten layer is filled into the plurality of trenches. A planarization process is performed on the tungsten layer to form a planarization layer on the tungsten layer. A first etching step is performed to completely etch away the planarization layer and a portion of the tungsten layer. The etching selectivity of the planarization layer and the tungsten layer in the first etching step is 1:1. A second etching step is further performed to continue etching the tungsten layer until the top surface of the tungsten layer is lower than the main surface of the semiconductor substrate.

These and other objectives of the present invention will no doubt become obvious to those of ordinary skill in the art after reading the following detailed description of the preferred embodiment that is illustrated in the various figures and drawings.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the invention.

Before the further description of the preferred embodiment, the specific terms used throughout the text will be described below.

The term "etch" is used herein to describe the process of patterning a material layer so that at least a portion of the material layer after etching is retained. For example, it is to be understood that the method of etching silicon involves patterning a mask layer (e.g., photoresist or hard mask) over silicon and then removing silicon from the area that is not protected by the mask layer. Thus, during the etching process, the silicon protected by the area of the mask will remain.

In another example, however, the term "etch" may also refer to a method that does not use a mask, but leaves at least a portion of the material layer after the etch process is complete. The above description is used to distinguish between "etching" and "removal". When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The terms "forming", "depositing" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

According to various embodiments, for example, deposition may be carried out in any suitable known manner. For example, deposition may include any growth, plating, or transfer of material onto the substrate. Some known techniques include physical vapor deposition (PVD), chemical vapor deposition (CVD), electrochemical deposition (ECD), molecular beam epitaxy (MBE), atomic layer deposition (ALD), and plasma enhanced CVD (PECVD).

The term "substrate" described in the text is commonly referred to as a silicon substrate. However, the substrate may also be any semiconductor material, such as germanium, gallium arsenide, indium phosphide and the like. In other embodiments, the substrate may be non-conductive, such as glass or sapphire wafers.

Figure 1:
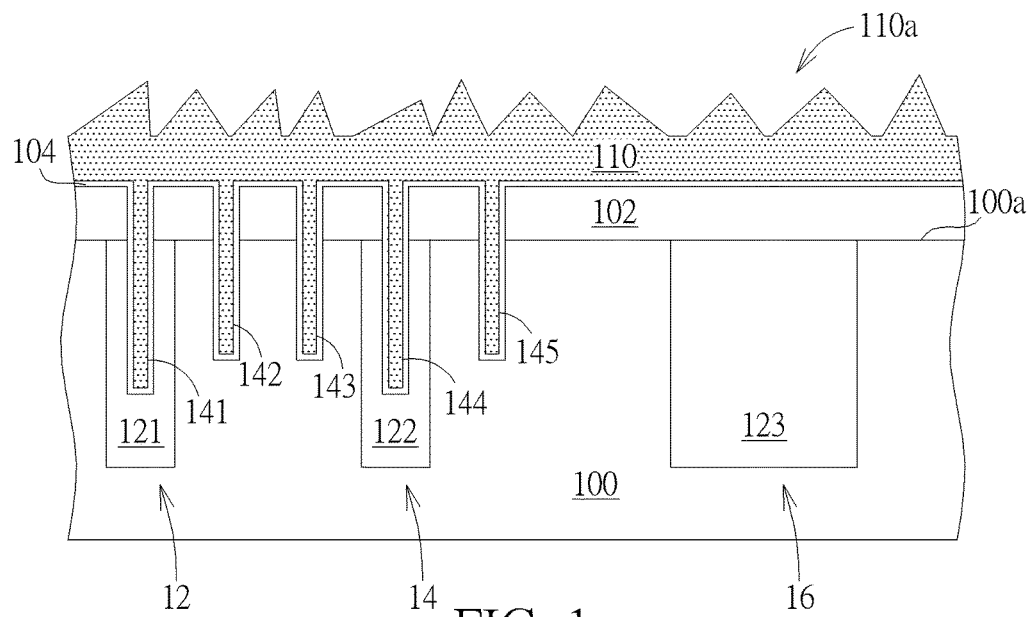
FIG. 1 to FIG. 5 are schematic diagrams illustrating a method for improving the micro-loading effect when recess etching a tungsten layer according to an embodiment of the present invention.

Please refer to FIG. 1 to FIG. 5, which are schematic diagrams of a method for improving the micro-loading effect when etching a tungsten layer according to an embodiment of the present invention. As shown in FIG. 1, a semiconductor substrate 100 having a main surface 100a is provided. Trench isolation structures 12, 14, 16 are formed in the semiconductor substrate 100. The trench isolation structures 12, 14, 16 respectively include trench fill insulating layers 121, 122, 123. The upper surfaces of the trench fill insulating layers 121, 122, 123 may be flush with the main surface 100a of the semiconductor substrate 100.

According to an embodiment of the present invention, a dielectric layer 102, such as a silicon oxide layer, is formed on the main surface 100a of the semiconductor substrate 100. Thereafter, a plurality of trenches 141~145 penetrating through the dielectric layer 102 and extending into the semiconductor substrate 100, such as buried word line trenches of a dynamic random access memory (DRAM), are formed in the semiconductor substrate 100. According to an embodiment of the present invention, the trenches 141 and 144 in FIG. 1 pass through the trench isolation structures 12 and 14, respectively, and the trenches 142 and 143 pass through an active region. According to an embodiment of the present invention, the bottoms of the trenches 141, 144 may be deeper into the semiconductor substrate 100 than the bottoms of the trenches 142, 143.

Next, a barrier layer 104, such as a titanium nitride layer, is deposited on the semiconductor substrate 100 in a blanket manner. According to an embodiment of the present invention, the barrier layer 104 may be formed by using a chemical vapor deposition (CVD) process, but not limited thereto. The barrier layer 104 uniformly and conformally covers the dielectric layer 102 and the inner walls of the trenches 141~145, but does not completely fill up the trenches 141~145.

Next, a tungsten layer 110 is deposited on the semiconductor substrate 100 in a blanket manner. The tungsten layer 110 fills into the plurality of trenches 141~145. At this point, the trenches 141~145 are completely filled with the barrier layer 104 and the tungsten layer 110. According to an embodiment of the present invention, the tungsten layer 110 has an uneven, rough surface 110a, which will cause a micro-loading effect when the tungsten layer 110 is subsequently recess etched. The present invention thus proposes an improved method of flattening the roughened surface 110a of the tungsten layer 110 before performing the recess etching of the tungsten layer 110.

Figure 2:
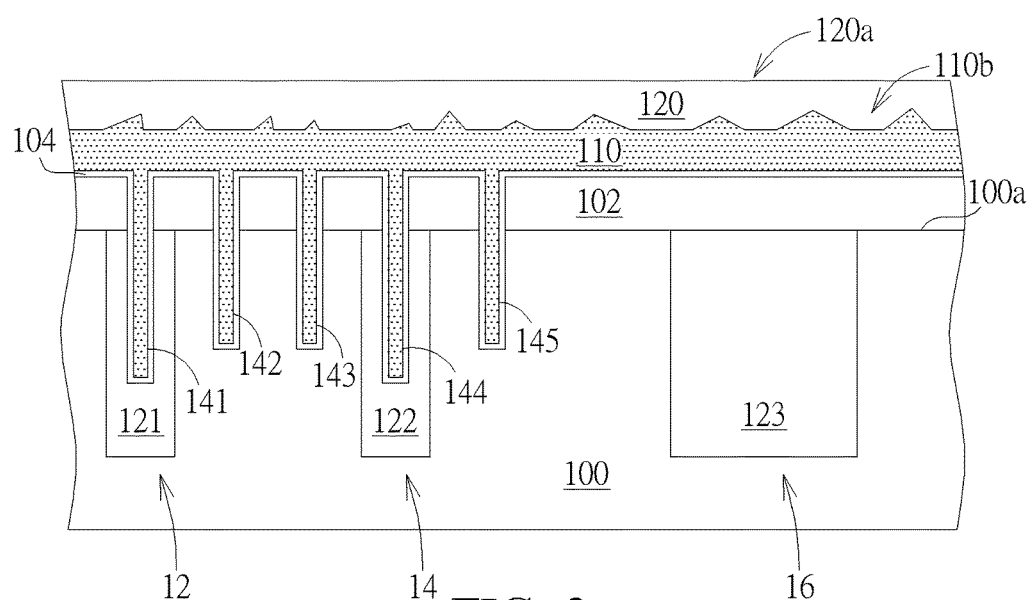

As shown in FIG. 2, a planarization process is performed on the tungsten layer 110 to form a planarization layer 120 on the tungsten layer 110. According to an embodiment of the present invention, the planarization process includes etching the tungsten layer 110 with plasma formed of a gas selected from the group consisting of $C_4F_6$, $C_4F_8$, or $SiCl_4/CF_4$ while providing a pulse bias condition, and currently depositing the planarization layer 120 on the tungsten layer 110. According to an embodiment of the present invention, the pulse bias condition at least includes the following parameters: a pulse frequency of 13.56 MHz, a bias power of 100 W, and a duty cycle (DC) of 20%. According to an embodiment of the present invention, the planarization layer 120 is a polymer layer.

According to an embodiment of the present invention, after the planarization process is completed, a surface 110b of the etched tungsten layer 110 can be obtained. The surface roughness of the surface 110b is lower than that of the original roughened surface 110a. The planarization layer 120 formed on the surface 110b of the tungsten layer 110 has a flat surface 120a.

Figure 3:
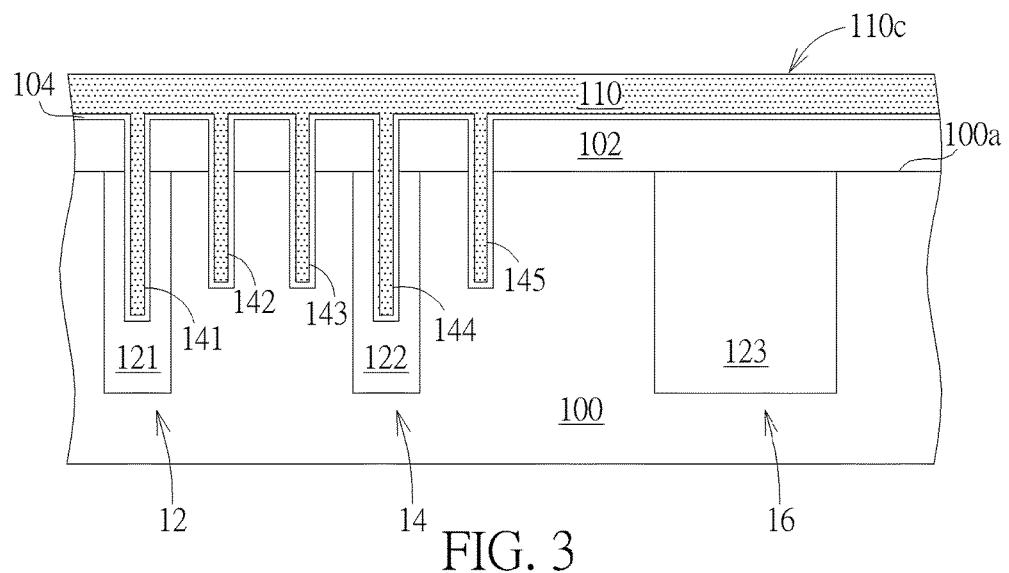

As shown in FIG. 3, a first etching step is performed to completely etch away the planarization layer 120 and a portion of the tungsten layer 120. The etching selectivity of the planarization layer 120 to the tungsten layer 110 in the first etching step is about 1:1. According to an embodiment of the present invention, the first etching step is not provided with any pulse bias. The planarization layer 120 and the tungsten layer 110 are etched with plasma formed of a gas containing $SF_6$ and Ar.

After the first etching step is completed, at this point, there is still a part of the tungsten layer 110 on the top surface of the dielectric layer 102, and the tungsten layer 110 has a flat surface 110c.

Figure 4:
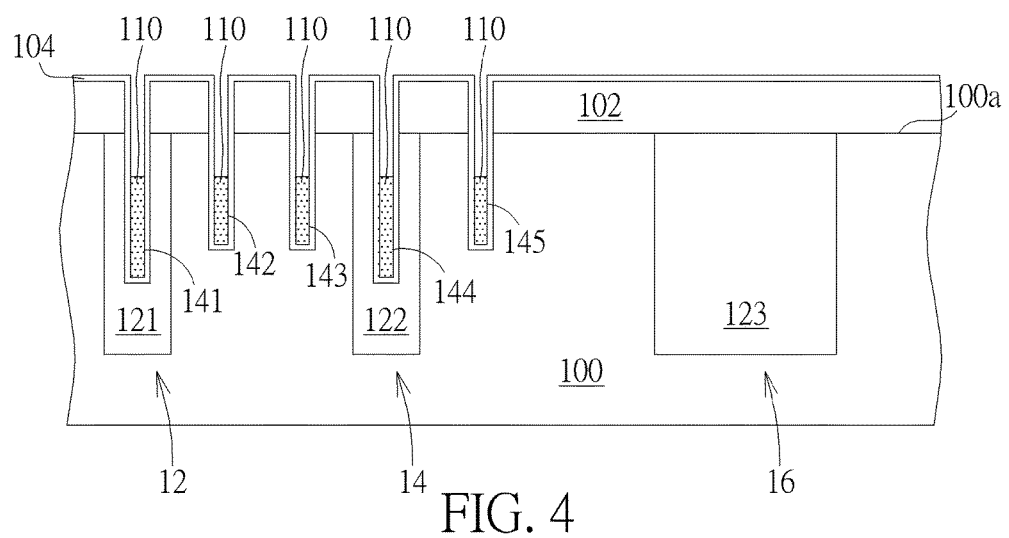

As shown in FIG. 4, subsequently, a second etching step, that is, a recess etching step is performed to continue etching the remaining tungsten layer 110 until the top surfaces 110d of the tungsten layer 110 is lower than the main surface 100a of the semiconductor substrate 100. The top surfaces 110d of the tungsten layer 110 within the plurality of trenches 141~145 are in the same horizontal level. According to an embodiment of the invention, the second etching step is performed by etching the tungsten layer 110 with the plasma formed by $SF_6$ and Ar while providing the pulse bias. At this point, part of the barrier layer 104 is exposed.

Figure 5:
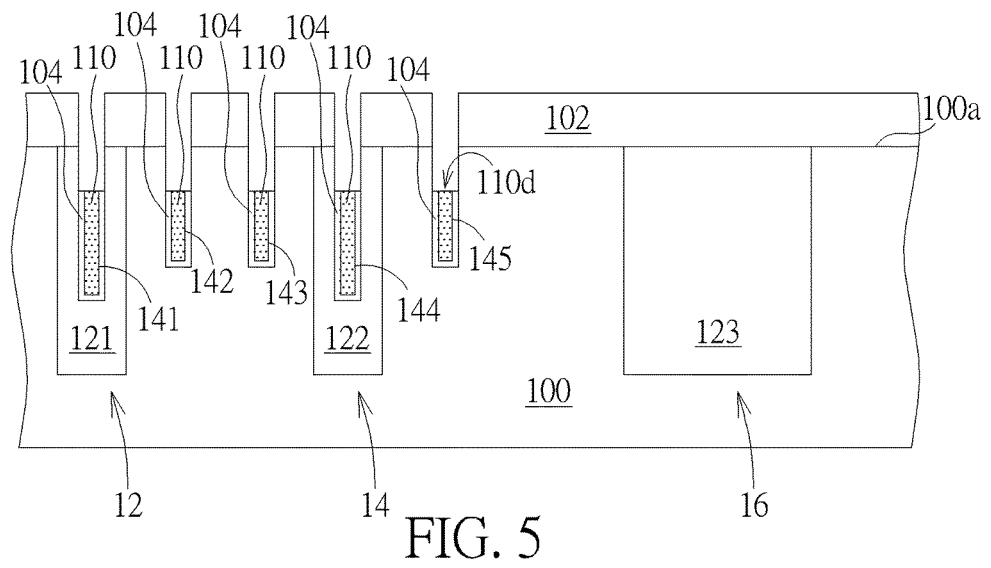

As shown in FIG. 5, a third etching step, that is, barrier layer etching is performed. For example, the exposed barrier layer 104 is etched by using an etching gas containing $Cl_2$ and Ar to complete the buried word lines. Subsequently, a chemical vapor deposition process may be performed and a dielectric cap layer (not shown) may be formed on the tungsten layer 110, which are well-known in the art and will not be described any further.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for improving micro-loading effect when recess etching a tungsten layer, comprising:
   providing a semiconductor substrate having a main surface, wherein a plurality of trenches is formed in the semiconductor substrate;
   blanket depositing a tungsten layer on the semiconductor substrate, wherein the plurality of trenches is filled with the tungsten layer;
   subjecting the tungsten layer to a planarization process to form a planarization layer on the tungsten layer;
   performing a first etching process to completely remove the planarization layer and partially remove the tungsten layer with an etch selectivity of planarization layer:tungsten layer=1:1; and
   performing a second etching process to etch remainder of the tungsten layer until a top surface of the tungsten layer is lower than the main surface of the semiconductor substrate.

2. The method according to claim 1, wherein the planarization process comprises:
   etching the tungsten layer with a plasma formed of a gas selected from the group consisting of $C_4F_6$, $C_4F_8$, or $SiCl_4/CF_4$ while providing a pulse bias condition, and currently depositing the planarization layer on the tungsten layer.

3. The method according to claim 1, wherein the pulse bias condition comprises the following parameters: a pulse frequency of 13.56 MHz, a bias power of 100 W, and a duty cycle (DC) of 20%.

4. The method according to claim 1, wherein the planarization layer is a polymer layer.

5. The method according to claim 1, wherein top surfaces of the tungsten layer within the plurality of trenches are in the same horizontal level.

6. The method according to claim 1, wherein the first etching step is not provided with any pulse bias, and wherein the planarization layer and the tungsten layer are etched with a plasma formed of a gas containing $SF_6$ and Ar.

7. The method according to claim 1, wherein the second etching step is performed by etching the tungsten layer with a plasma formed by $SF_6$ and Ar while providing a pulse bias.

* * * * *

UNITED STATES PATENT AND TRADEMARK OFFICE
CERTIFICATE OF CORRECTION

PATENT NO.         : 10,141,223 B2
APPLICATION NO.    : 15/869107
DATED              : November 27, 2018
INVENTOR(S)        : Li-Chiang Chen et al.

It is certified that error appears in the above-identified patent and that said Letters Patent is hereby corrected as shown below:

On the Title Page

Item (73), the residence of second assignee, "Quanzhou, Fujian province" should read --Quanzhou, Fujian province (CN)--.

Signed and Sealed this
Fifth Day of February, 2019

Andrei Iancu
*Director of the United States Patent and Trademark Office*